United States Patent [19]

Sato

[11] Patent Number: 5,093,630

[45] Date of Patent: Mar. 3, 1992

[54] OVERVOLTAGE PROTECTION IN SERIES THYRISTOR STRING FOR STATIC VAR COMPENSATOR

[75] Inventor: Naoko Sato, Tama, Japan

[73] Assignee: Kabushiki Kaisha Toshiba, Kawasaki, Japan

[21] Appl. No.: 507,491

[22] Filed: Apr. 11, 1990

[30] Foreign Application Priority Data

Apr. 14, 1989 [JP] Japan ................................. 1-93090

[51] Int. Cl.$^5$ ............................................... G05F 1/70
[52] U.S. Cl. ..................................... 323/210; 363/68
[58] Field of Search ................ 307/646, 643; 323/210, 323/211; 363/54, 68

[56] References Cited

U.S. PATENT DOCUMENTS

| 3,958,172 | 5/1976 | Beck. | |
|---|---|---|---|
| 4,325,114 | 4/1982 | Kobayashi et al. | 363/68 |
| 4,337,430 | 6/1982 | Flego | 323/323 |
| 4,571,535 | 2/1986 | Gyugyi | 323/211 |
| 4,797,587 | 1/1989 | Tschudi et al. | 307/646 |
| 4,859,884 | 8/1989 | Yoshino | 323/210 |

FOREIGN PATENT DOCUMENTS 0116706 10/1986 European Pat. Off. .
3107333 3/1982 Fed. Rep. of Germany .
3623889 1/1987 Fed. Rep. of Germany .
8300958 3/1983 PCT Int'l Appl. .

Primary Examiner—William H. Beha, Jr.
Attorney, Agent, or Firm—Oblon, Spivak, McClelland, Maier & Neustadt

[57] ABSTRACT

A gate pulse generator for a static var compensator (SVC) constituted by a thyristor switched capacitor (TSC) comprises voltage detectors for respectively detecting forward and reverse voltages applied to antiparallel-connected thyristors in the TSC. The antiparallel-connected thyristors comprise a plurality of series-connected forward thyristors and a plurality of series-connected reverse thyristors. The gate pulse generator monitors the forward and reverse voltages and determines whether a period in which both the forward and reverse voltages are zero continues for a predetermined period while reverse-phase sides of the antiparallel-connected thyristors are held in conduction periods, respectively. The gate pulse generator prolongs an active period of a forward conduction period signal by the predetermined period. Upon switching from in-phase conduction to reverse-phase conduction, even if some of the plurality of series-connected thyristors are turned off, these thyristors are turned on again within the predetermined period, and an overvoltage is not applied to these thyristors.

15 Claims, 2 Drawing Sheets

OVERVOLTAGE PROTECTION IN SERIES THYRISTOR STRING FOR STATIC VAR COMPENSATOR

BACKGROUND OF THE INVENTION

1. Field of the Invention

The present invention relates to a static var compensator and, more particularly, to a thyristor switched capacitor and a gate pulse generator for a static var compensator used to perform var compensation in a power system or power distribution system or to suppress variations in voltage.

2. Description of the Related Art

According to a method of generating a gate pulse in a conventional static var compensator, when a circuit voltage in a power system is distorted, this voltage often fluctuates centering on 0 V, and a sufficient reverse voltage cannot be applied to a plurality of series-connected thyristors constituting a var compensator. Some of these thyristors are turned off while some are not turned off, thus causing a partial blocking state. In the partial blocking state, a high circuit voltage is applied to only the thyristors which are kept off. If this high circuit voltage exceeds a breakdown voltage of the turned-off thyristors, these thyristors may be damaged.

SUMMARY OF THE INVENTION

It is according an object of the present invention to provide a gate pulse generator which can eliminate the drawback described above, protect thyristor elements from partial blocking, and prevent damage to a thyristor valve.

A gate pulse generator for a static var compensator (SVC) constituted by, e.g., a thyristor switched capacitor (TSC) comprises voltage detectors for respectively detecting forward and reverse voltages applied to antiparallel-connected thyristors in the TSC. The antiparallel-connected thyristors comprise a plurality of series-connected forward thyristors and a plurality of series-connected reverse thyristors.

The gate pulse generator monitors the forward and reverse voltages and determines whether a period in which both the forward and reverse voltages are substantially zero continues for a predetermined period while reverse-phase sides of the thyristors in the TSC are held in conduction periods, (or forward-phase sides of the thyristors in the TSC are held in conduction periods) respectively.

The gate pulse generator prolongs an active period of a forward conduction period signal (or reverse conduction period signal) by the predetermined period. Upon switching from in-phase conduction to reverse-phase conduction (or upon switching from reverse-phase conduction to in-phase conduction), even if some of the plurality of series-connected thyristors are turned off, these thyristors are turned on again within the predetermined period, and an overvoltage is not applied to these thyristors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
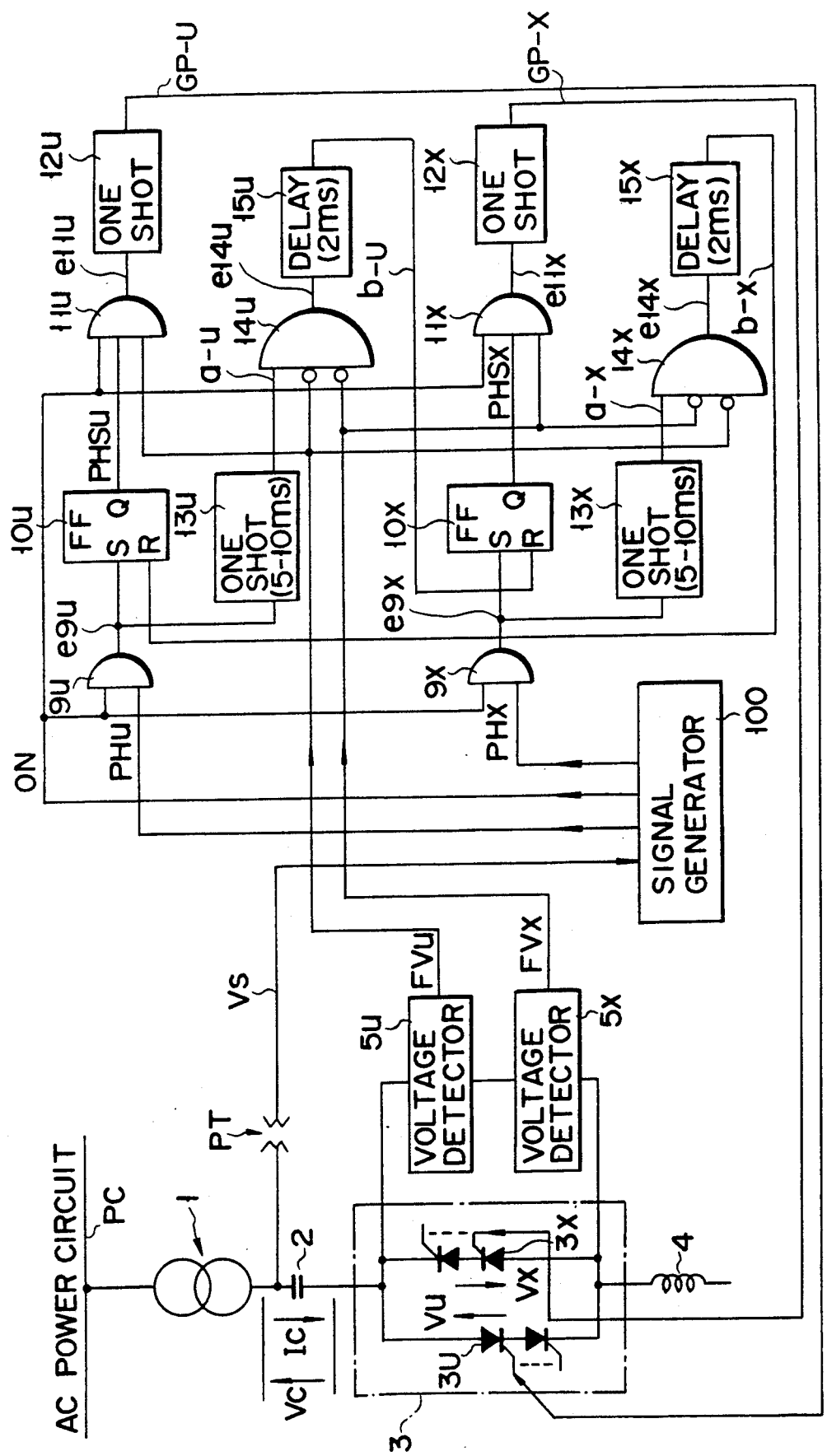
FIG. 1 shows a gate pulse generator for use with a static var compensator (SVC) which is formed of a thyristor switched capacitor (TSC)

FIG. 1 shows an arrangement of a TSC for static var compensation.

Referring to FIG. 1, reference numeral 1 denotes a voltage transformer connected to power circuit PC; 2, a capacitor; 3, a thyristor switch constituted by a plurality of antiparallel-connected thyristors; 4, a series-connected reactor; 5u and 5x, voltage detectors for respectively detecting forward and reverse voltages Vu and Vx applied to thyristor switch 3; and 3U and 3X, a plurality of forward thyristors and a plurality of reverse thyristors, both of which constitute thyristor switch 3. Each of thyristors 3U and 3X comprises two or more series-connected thyristor elements. This series connection achieves a breakdown voltage higher than that of a low-breakdown thyristor element.

Reference symbols FVu and FVx denote forward and reverse voltage signals generated by voltage detectors 5u and 5x in response to forward and reverse voltages Vu and Vx, respectively; Vs, a circuit voltage at the secondary winding of voltage transformer 1; Vc, a voltage applied to capacitor 2; and Ic, a charge current of capacitor 2.

Detailed arrangements of voltage detectors 5u and 5x are disclosed in FIG. 10 of U.S. Pat. No. 4,859,884 (Yoshino) issued on Aug. 22, 1989. All the disclosed contents of this U.S.P. are incorporated in the specification of the present invention.

Reference numerals 9u and 9x denote AND gates for logically ANDing phase signals PHu and PHx and ON signal ON for the TSC, respectively; 10u and 10x, flip-flops for generating conduction period signals PHSu and PHSx, respectively; 11u and 11x, AND gates for logically ANDing conduction period signals PHSu and PHSx from flip-flops 10u and 10x, voltage signals FVu and FVx from the thyristor switch, and ON signal ON, respectively; 12u, 12x, 13u, and 13x, one-shot circuits, respectively; 14u and 14x, AND gates for logically ANDing outputs from one-shot circuits 13u and 13x and inverted signals of voltage signals FVu and FVx, respectively; and 15u and 15x, delay circuits for outputting signals b-u and b-x of logic "1" during periods (t43 and t33) between a time when outputs e14u and e14x from AND gates 14u and 14x are set at "1" over a predetermined period (2 ms) and a time when outputs e14u and e14x go to "0", respectively.

Figure 2:
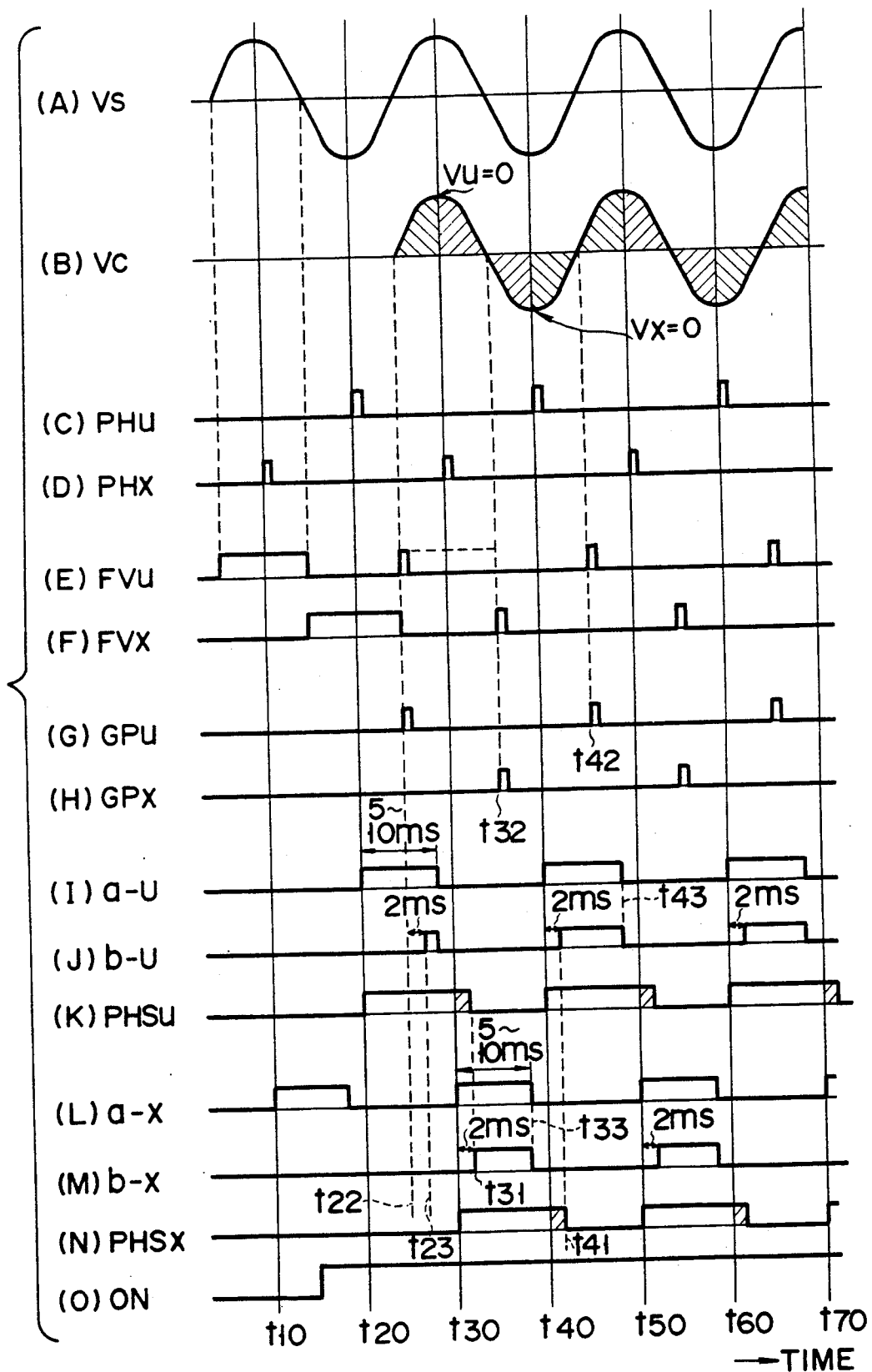
FIGS. 2(a) to 2(O) are timing charts for explaining the circuit operation of the gate pulse generator shown in FIG. 1.

FIG. 2 shows a relationship between TSC circuit voltage Vs, charge voltage Vc of capacitor 2, phase signals PHu and PHx, forward and reverse voltage signals FVu and FVx, gate pulse signals GPu and GPx, outputs a-u and a-x from one-shot circuits 13u and 13x, reset signals b-u and b-x for flip-flops 10x and 10u, and conduction period signals PHSu and PHSx. Conduction period signal PHSu is reset when both voltage detection signals FVu and FVx are kept at "0" over the predetermined period (2 ms) after conduction of the reverse thyristors is confirmed, i.e., after the reverse-phase period is set and PHx is set at "1". Upon setting (t30) of an x-phase conduction period, even if some of the plurality of series-connected thyristor elements 3u are turned off by variations in circuit PC voltage and fluctuations in capacitor voltage Vc, the OFF thyristors can be turned on again within the predetermined period (2 ms) in response to a gate pulse. That is, u-phase conduction of the antiparallel-connected thyristors is prolonged by the predetermined period (e.g., 2 ms or more). When all the plurality of u-phase series-connected thyristor elements 3u can be turned off (t31), signal PHSu goes to "0", thereby preventing partial blocking.

X-phase conduction is checked by signal a-x for a predetermined period (e.g., 5 to 10 ms) from a leading edge (t30) of x-phase signal PHx (x-phase conduction period PHSx can be similarly set as in the u-phase except that the phase is inverted by 180°).

Single phase conduction has been described above, but a similar operation can be performed for a 3-phase TSC.

The conduction period (PHSu) continues from a time (t31) when reverse-phase (x) conduction continues over the predetermined period (2 ms) to a time when all the thyristors (3u) connected in series with their own phase (u) can be turned off. The gate pulse signal is generated within this predetermined period (2 ms) to turn on the OFF thyristors again. For this reason, in the TSC unit arranged by series-connecting the plurality of antiparallel-connected thyristors (3u and 3x), the partial blocking state can be eliminated, and damage to the thyristor valve can be prevented.

A technique associated with the present invention is disclosed in the following IEEE reference: K. Murabayashi et al., "High Voltage, Large Capacity Light-triggered Thyristor Valve for Static Var Compensators" *Proceedings of the International Conference on Power Conversion and Industrial Control* (Oct. 22–23, 1986; Singapore), Organized by IEEE-Institute of Electrical & Electronics Engineers (Singapore Section).

All the disclosed contents of the above reference are incorporated in the specification of the present invention.

Although a thyristor switched capacitor (TSC) is exemplified for a static var compensator in the embodiment of FIGS. 1 and 2, the gate pulse generator of the present invention can also be applied to a var compensator using a thyristor switched reactor (TSR).

Further, although the gate pulse generator of FIG. 1 is constituted by hardware logics, operation defined by the control timing shown in FIG. 2 can be reduced to practice by a software using a conventional microcomputer.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A gate pulse generator for a static var compensator, comprising:
   a thyristor switch being formed of a first block of series-connected thyristors and a second block of series-connected thyristors, said second block being anti-parallel connected to said first block;
   first detector means for detecting a first voltage applied across said thyristor switch to generate a first voltage signal when the first block thyristors is forwardly biased;
   first firing means for firing said first block thyristors in accordance with a first conduction period signal and said first voltage signal;
   first expanding means for expanding by a first predetermined period an active period of said first conduction period signal from time when said first voltage is substantially zero;
   second detector means for detecting a second voltage applied across said thyristor switch to generate a second voltage signal when the second block thyristors is forwardly biased;
   second firing means for firing said second block thyristors in accordance with a second conduction period signal and said second voltage signal; and
   second expanding means for expanding by a second predetermined period an active period of said second conduction period signal from time when said second voltage is substantially zero.

2. A gate pulse generator according to claim 1, wherein said thyristor switch is provided with a capacitor connected in series thereto, said thyristor switch and said capacitor constituting a thyristor switched capacitor.

3. A gate pulse generator according to claim 1, wherein said thyristor switch is provided with a reactor connected in series thereto, said thyristor switch and said reactor constituting a thyristor switched reactor.

4. A gate pulse generator according to claim 1, wherein said second firing means includes second generator means for generating s aid second conduction period signal when both said second phase signal and said ON signal are generated.

5. A gate pulse generator according to claim 4, wherein said second generator means includes means for terminating the active period of said second conduction period signal, after elapsing said second predetermined period running from a time when both said first and second voltages are substantially zero.

6. A gate pulse generator according to claim 1, wherein said first generator means includes means for terminating the active period of said first conduction period signal, after elapsing said first predetermined period running from a time when both said first and second voltages are substantially zero.

7. A gate pulse generator according to claim 1, further comprising:
   means for generating a first phase signal when said first block thyristors is to be turned on, a second phase signal when said second block thyristors is to be turned on, and an ON signal when said thyristor switched capacitor is to be activated,
   wherein said first expanding means includes:
   first delay means for delaying a logical AND of said second phase signal and said ON signal by a first delay time to provide a first delayed signal;
   first AND means for detecting a first logical AND of said first delayed signal, an inverted logic level of said first voltage signal, and an inverted logic level of said second voltage signal;

second delay means for delaying said first logical AND by said first predetermined period to provide a second delayed signal; and a first flip-flop which is set by a logical AND of said first phase signal and said ON signal to activate said first conduction period signal, and which is reset by said second delayed signal to inactivate said first conduction period signal.

8. A gate pulse generator according to claim 7, wherein said second expanding means includes:

third delay means for delaying a logical AND of said first phase signal and said ON signal by a second delay time to provide a third delayed signal;

second AND means for detecting a second logical AND of said second delayed signal, an inverted logic level of said first voltage signal, and an inverted logic level of said second voltage signal;

fourth delay means for delaying said second logical AND by said second predetermined period to provide a fourth delayed signal; and a second flip-flop which is set by a logical AND of said second phase signal and said ON signal to activate said second conduction period signal, and which is reset by said fourth delayed signal to inactivate said second conduction period signal.

9. A gate pulse generator, comprising:

a thyristor switch being formed of a first block of series-connected thyristors and a second block of series-connected thyristors, said second block being anti-parallel connected to said first block;

first detector means for detecting a first voltage applied across said thyristor switch to generate a first voltage signal when the first block thyristors is forwardly biased;

first firing means for firing said first block thyristors in accordance with a first conduction period signal and said first voltage signal;

first expanding means for expanding by a first predetermined period an active period of said first conduction period signal from time when said first voltage is substantially zero;

second detector means for detecting a second voltage applied across said thyristor switch to generate a second voltage signal when the second block thyristors is forwardly biased;

second firing means for firing said second block thyristors in accordance with a second conduction period signal and said second voltage signal; and second expanding means for expanding by a second predetermined period an active period of said second conduction period signal from time when said second voltage is substantially zero;

means for generating a first phase signal when said first block thyristors are too be turned on, a second phase signal when said second block thyristors are to be turned on, and an ON signal when said thyristor switched capacitor is to be activated, wherein said first firing means includes first generator means for generating said first conduction period signal when both said first phase signal and said ON signal are generated.

10. A gate pulse generator according to claim 9, wherein said second firing means includes second generator means for generating said second conduction period signal when both said second phase signal and said ON signal are generated.

11. A gate pulse generator according to claim 4, wherein said second generator means includes means for terminating the active period of said second conduction period signal, after elapsing said second predetermined period running from a time when both said first and second voltages are substantially zero.

12. A gate pulse generator according to claim 9, wherein said first generator means includes means for terminating the active period of said first conduction period signal, after elapsing said first predetermined period running from a time when both said first and second voltages are substantially zero.

13. A gate pulse generator according to claim 9, further comprising:

means for generating a first phase signal when said first block of thyristors is to be turned on, a second phase signal when said second block of thyristors is too be turned on, and an ON signal when said thyristor switch capacitor is to be activated;

wherein said first expanding means including first delay means for delaying a logical AND of said second phase signal and said ON signal by a first delay time to provide a first delayed signal, first AND means for detecting a first logical AND of said first delayed signal, an inverted logic level of said first voltage signal, and an inverted logic level of said second voltage signal, second delay means for delaying said first logical AND by said first predetermined period too provide a second delayed signal, and a first flip-flop which is set by a logical AND of said first phase signal and said ON signal to activate said first conduction period signal, and which is reset by said second delayed signal to inactivate said first conduction period signal.

14. A gate pulse generator according to claim 13, wherein said second expanding means includes:

third delay means for delaying a logical AND of said first phase signal and said ON signal by a second delay time provide a third delayed signal; second AND means for detecting a second logical AND of said second delayed signal, an inverted logic level of said first voltage signal, and an inverted logic level of said second voltage signal;

fourth delay means for delaying said second logical AND by said second predetermined period to provide a fourth delayed signal; and a second flip-flop which is set by a logical AND of said second phase signal and said ON signal to activate said second conduction period signal, and which is reset by said fourth delayed signal to inactivate said second conduction period signal.

15. A gate pulse generator for a static var compensator comprising a thyristor switch obtained by series-connecting a plurality of antiparallel-connected thyristors, a capacitor ON/OFF-controlled by said thyristor switch, and a reactor series-connected to said capacitor, comprising:

flip-flop means, being set by a first phase signal having a predetermined phase difference from a voltage applied to said static var compensator, for providing an output signal, said flip-flop means being reset by an output from a conduction detector of the thyristors operated during a predetermined period starting from the generation of a second phase signal which is generated in a phase opposite to the first phase signal;

voltage detecting means for detecting a voltage applied to said thyristor switch to provide a voltage signal; and means for detecting a logical AND of the output signal from said flip-flop means and the voltage signal from said voltage detecting means, and for applying a gate pulse having a predetermined width to the thyristors constituting said thyristor switch when the detected logical AND is set at "1".

* * * * *